United States Patent [19]
Caldwell

[11] Patent Number: 5,594,222
[45] Date of Patent: Jan. 14, 1997

[54] TOUCH SENSOR AND CONTROL CIRCUIT THEREFOR

[75] Inventor: David W. Caldwell, Lapeer, Mich.

[73] Assignee: Integrated Controls, Lapeer, Mich.

[21] Appl. No.: 328,852

[22] Filed: Oct. 25, 1994

[51] Int. Cl.[6] ............................................. H03K 17/975
[52] U.S. Cl. ............................................. 200/600; 341/33
[58] Field of Search ................................. 200/5 A, 600; 361/278, 280; 307/116, 99; 341/22, 33, 26, 24; 345/173, 174; 400/479.1

[56] References Cited

U.S. PATENT DOCUMENTS

| | | | |
|---|---|---|---|
| 3,200,306 | 8/1965 | Atkins et al. | 345/174 |
| 3,254,313 | 5/1966 | Atkins et al. | 200/600 |
| 3,275,897 | 9/1966 | Atkins et al. | 200/600 X |
| 4,291,303 | 9/1981 | Cutler et al. | 345/174 |
| 4,379,287 | 4/1983 | Tyler et al. | 200/600 X |
| 4,380,040 | 4/1983 | Posset | 200/600 |
| 4,394,643 | 7/1983 | Williams | 400/479.1 X |
| 4,400,758 | 8/1983 | Frame | 400/479.1 X |
| 4,405,917 | 9/1983 | Chai | 341/26 |
| 4,405,918 | 9/1983 | Wall et al. | 341/26 |
| 4,529,968 | 7/1985 | Hilsum et al. | 200/600 X |
| 4,535,254 | 8/1985 | Khatri | 307/38 |
| 4,550,310 | 10/1985 | Yamaguchi et al. | 307/99 |
| 4,562,315 | 12/1985 | Aufderheide | 200/5 A |
| 4,584,519 | 4/1986 | Groudis | 307/116 X |
| 4,731,548 | 3/1988 | Ingraham | 307/116 |
| 4,733,222 | 3/1988 | Evans | 341/33 |
| 4,740,781 | 4/1988 | Brown | 345/174 |
| 4,855,550 | 8/1989 | Schultz, Jr. | 200/600 |
| 5,063,306 | 11/1991 | Edwards | 307/308 |
| 5,153,572 | 10/1992 | Caldwell et al. | 345/174 |
| 5,189,417 | 2/1993 | Caldwell et al. | 341/26 |
| 5,239,152 | 8/1993 | Caldwell et al. | 200/600 |

*Primary Examiner*—J. R. Scott
*Attorney, Agent, or Firm*—Young & Basile, P.C.

[57] ABSTRACT

A low impedance touch sensor detects manual contact of a dielectric substrate by a human user. The touch sensor includes a first conductive electrode pad having a closed, continuous geometric form and a second conductive electrode which substantially co-planarly surrounds the first electrode and is spaced from the first electrode by a channel. The first and second electrodes are disposed on the same surface of the substrate. An active electrical component, such as a transistor is located on the substrate proximate the first and second electrodes, and is electrically coupled to the first and second electrodes.

32 Claims, 6 Drawing Sheets

TOUCH SENSOR AND CONTROL CIRCUIT THEREFOR

FIELD OF THE INVENTION

The present invention relates to a touch panel system, and more particularly, a touch sensor attached to one side of a substrate for detecting user contact of the opposite side of the substrate.

BACKGROUND OF THE INVENTION

Touch panels are used in various applications to replace conventional mechanical switches; e.g., kitchen stoves, microwave ovens, and the like. Unlike mechanical switches, touch panels contain no moving parts to break or wear out. Mechanical switches used with a substrate require some type of opening through the substrate for mounting the switch. These openings, as well as openings in the switch itself, allow dirt, water and other contaminants to pass through the substrate or become trapped within the switch. Certain environments contain a large number of contaminants which can pass through substrate openings, causing electrical shorting or damage to the components behind the substrate. However, touch panels can be formed on a continuous substrate sheet without any openings in the substrate. Also, touch panels are easily cleaned due to the lack of openings and cavities which collect dirt and other contaminants.

Existing touch panel designs provide touch pad electrodes attached to both sides of the substrate; i.e., on both the "front" surface of the substrate and the "back" surface of the substrate. Typically, a tin antimony oxide (TAO) electrode is attached to the front surface of the substrate and additional electrodes are attached to the back surface. The touch pad is activated when a user contacts the TAO electrode. Such a design exposes the TAO electrode to damage by scratching, cleaning solvents, and abrasive cleaning pads. Furthermore, the TAO electrode adds cost and complexity to the touch panel.

Known touch panels often use a high impedance design which may cause the touch panel to malfunction when water or other liquids are present on the substrate. This presents a problem in areas where liquids are commonly found, such as a kitchen. Since the pads have a higher impedance than the water, the water acts as a conductor for the electric fields created by the touch pads. Thus, the electric fields follow the path of least resistance; i.e., the water. Also, due to the high impedance design, static electricity can cause the touch panel to malfunction. The static electricity is prevented from quickly dissipating because of the high touch pad impedance.

Existing touch panel designs also suffer from problems associated with crosstalk between adjacent touch pads. The crosstalk occurs when the electric field created by one touch pad interferes with the field created by an adjacent touch pad, resulting in an erroneous activation such as activating the wrong touch pad or activating two pads simultaneously.

Known touch panel designs provide individual pads which are passive. No active components are located in close proximity to the touch pads. Instead, lead lines connect each passive touch pad to the active detection circuitry. The touch pad lead lines have different lengths depending on the location of the touch pad with respect to the detection circuitry. Also, the lead lines have different shapes depending on the routing path of the line. The differences in lead line length and shape cause the signal level on each line to be attenuated to a different level. For example, a long lead line with many corners may attenuate the detection signal significantly more than a short lead line with few corners. Therefore, the signal received by the detection circuitry varies considerably from one pad to the next. Consequently, the detection circuitry must be designed to compensate for large differences in signal level.

Many existing touch panels use a grounding mechanism, such as a grounding ring, in close proximity to each touch pad. These grounding mechanisms represent additional elements which must be positioned and attached near each touch pad, thereby adding complexity to the touch panel. Furthermore, certain grounding mechanisms require a different configuration for each individual touch pad to minimize the difference in signal levels presented to the detection circuitry. Therefore, additional design time is required to design the various grounding mechanisms.

SUMMARY OF THE INVENTION

The present invention solves the above-mentioned problems associated with existing touch panel designs by providing an active, low impedance touch sensor attached to only one side of a dielectric substrate. The inventive touch sensor has a first conductive electrode pad and a second conductive electrode which substantially surrounds the first electrode in a spaced apart relationship. The first electrode pad has a closed, continuous geometric shape with an area providing substantial contact coverage by a human appendage. Both electrodes are attached to the same surface of the substrate. An active electrical component is placed in close proximity to the electrodes.

The inventive touch pad can be used in place of existing touch pads or to replace conventional switches. The touch pad is activated when a user contacts the substrate with a human appendage, such as a fingertip. The touch pads can be used to turn a device on or off, adjust temperature, set a clock or timer, or any other function performed by a conventional switch. In addition to solving problems associated with existing touch pad designs, the present invention is especially useful in applications which presently use membrane-type switches, such as photocopiers and fax machines. The inventive touch pad design operates properly with liquids present on the substrate and in the presence of static electricity. The touch pad is well-suited for use in a kitchen or other environment where water, grease and other liquids are common, such as control panels for ranges, ovens and built-in cooktops.

In the preferred form, touch pad electrodes are attached to the back surface of a substrate. The back surface of the substrate is opposite the front or "touched" surface, thereby preventing contact of the electrodes by the user. Since the touch pad is not located on the front surface of the substrate, the pad is not damaged by scratching, cleaning solvents or any other contaminants which contact the front surface of the substrate. Furthermore, the cost and complexity of the touch panel is reduced since a TAO pad is not required on the front surface of the substrate.

In the preferred form, a strobe line is electrically connected to the outer electrode and delivers a strobe signal to the outer electrode. A strobe signal applied to the strobe line creates an electric field between the outer electrode and the center electrode. The electric field paths are in opposition to one another, thereby reducing the possibility of crosstalk between adjacent pads. The electric field path is arc-shaped and extends through the substrate and past the front surface. A sense line is attached to the substrate proximate the touch pad and carries a detection signal from the touch pad to a peak detector circuit. The detection signal level is altered when the substrate is touched by a user.

In the preferred form, an active electrical component, such as a surface mount transistor, is located at each touch pad. Preferably, the transistor is connected between the sense line, the center electrode and the outer electrode of each pad. The transistor acts to amplify and buffer the detection signal at the touch pad, thereby reducing the difference in signal level between individual touch pads due to different lead lengths and lead routing paths. Therefore, the difference in voltage levels from one pad to the next is significantly reduced, providing a more uniform detection voltage among all touch pads.

A plurality of touch pads may be arranged on the substrate in a matrix. Using a matrix configuration, the strobe signal is applied to a particular column of touch pads while the sense line is monitored for a particular row of touch pads. By applying the strobe to a column of pads and monitoring the sense line from a row of pads, a particular pad is selected.

DETAILED DESCRIPTION OF THE PREFERRED EMBODIMENT

Figure 1:
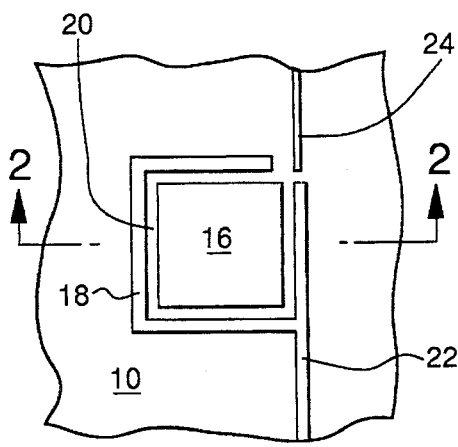
FIG. 1 illustrates an inventive touch pad as viewed from the back surface of the substrate with the transistor and resistor removed.

Referring to FIG. 1, a single touch pad is shown attached to a dielectric substrate 10. Substrate 10 has a substantially uniform thickness and can be manufactured from any type of dielectric material, such as glass, ceramic or plastic. In the preferred embodiment, substrate 10 is manufactured from glass and has a uniform thickness of approximately 3 mm. The thickness of substrate 10 varies with the particular application such that a thicker substrate is used where additional strength is required. If substrate 10 is manufactured from glass, the substrate can be as thin as approximately 1.1 mm and as thick as approximately 5 mm. If substrate 10 is manufactured from plastic, the substrate can be less than 1mm thick, similar to the material used in plastic membrane switches. A thin substrate 10 may permit the touch pad to be operated by a user wearing a glove or mitten.

Figure 2:
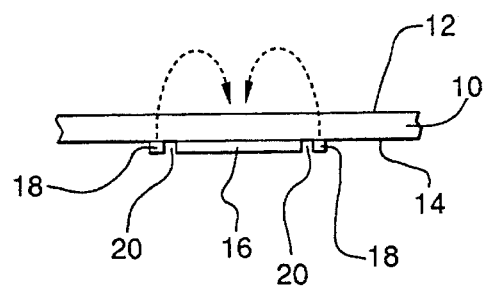
FIG. 2 is a side cross-sectional view of the touch pad and substrate with the transistor and resistor removed.

Substrate 10 has a front surface 12 and an opposite back surface 14 (as shown in FIG. 2). A user activates the touch pad by touching front surface 12 of substrate 10. The touch pad includes a thin, conductive center electrode pad 16 and a thin, conductive outer electrode 18 which substantially surrounds the center electrode. A channel 20 is located between center electrode 16 and outer electrode 18. Electrodes 16 and 18 are positioned such that channel 20 has a substantially uniform width.

Preferably, center electrode 16 has dimensions such that the electrode is substantially covered by a user's fingertip or other appendage when touched.

In the preferred embodiment, center electrode 16 is square and outer electrode 18 has a square shape which conforms to the shape of the center electrode. However, it will be understood that various closed, continuous geometric shapes may also be used for the center electrode including, but not limited to, rectangles, trapezoids, circles, ellipses, triangles, hexagons, and octagons. Regardless of the shape of center electrode 16, outer electrode 18 substantially surrounds the center electrode linearly in a spaced apart relationship, and channel 20 has a generally uniform width.

Preferably, center electrode 16 is a solid conductor. However, center electrode 16 may also have a plurality of apertures or may have a mesh or grid pattern. It is important that center electrode 16 have a plurality of electrical contact points in substantially the same plane and having the same electrical potential.

As shown in FIG. 1, a strobe line 22 is connected to outer electrode 18. Strobe line 22 provides a strobe signal (shown in FIG. 8) to outer electrode 18. In the preferred embodiment, the strobe signal is a square wave oscillating between 0 and +5 volts at a frequency between 100 kHz and 200 kHz. Alternatively, the strobe signal may have a frequency less than 100 kHz or greater than 200 kHz, depending on the detection circuitry used. Furthermore, the strobe signal may oscillate between 0 and +3 volts, 0 and +12 volts, 0 and +24 volts, −5 volts and +5 volts, or any other voltage range, depending on the voltage readily available from the device being controlled.

The strobe signal has a sharp rising edge (shown in FIG. 8) which creates a difference in the electrical potential between outer electrode 18 and inner electrode 16. This difference in potential between electrodes 16 and 18 creates an arc-shaped electric field between the electrodes, as shown by the dashed lines in FIG. 2. The electric field extends through substrate 10 and past front surface 12.

Although not shown in FIG. 2, the electric field between electrodes 16 and 18 follows a similar arc-shaped path away from substrate 10 rather than through the substrate. This path is a mirror image of the dashed lines shown in FIG. 2, extending downwardly rather than upwardly.

As shown in FIG. 2, the electric fields created are in opposition to one another. For example, the two field paths shown in FIG. 2 originate from electrode 18, at opposite sides of the pad. Since the field paths each terminate at center electrode 16, the paths travel toward one another. Thus, all field paths originate at outer electrode 18 and travel inwardly toward center electrode 16.

Referring again to FIG. 1, a sense line 24 is attached to substrate 10 adjacent outer electrode 18. Sense line 24 carries a detection signal from the touch pad to the remainder of the detection circuitry discussed below.

Figure 3:
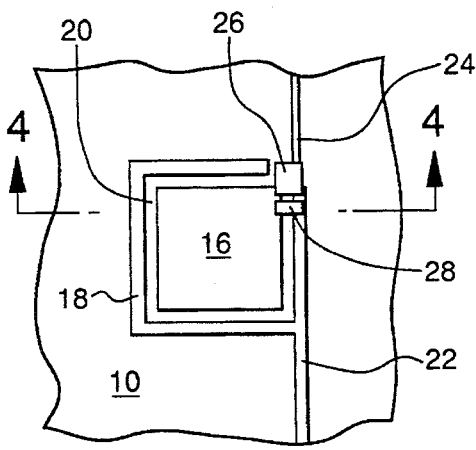
FIG. 3 is the same view as that shown in FIG. 1, but with the transistor and resistor attached.
Figure 4:
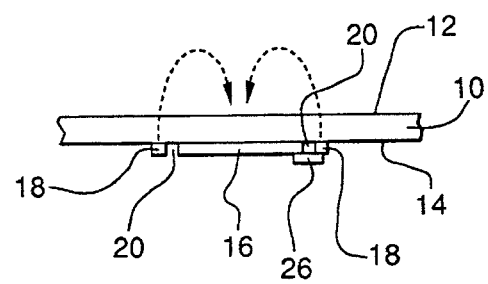
FIG. 4 is the same view as that shown in FIG. 2, but with the transistor and resistor attached.

As shown in FIG. 3, a surface mount transistor 26 and a surface mount resistor 28 are electrically connected to the touch pad. Resistor 28 is connected between center electrode 16 and outer electrode 18. In the preferred embodiment, resistor 28 has a value of 10 K ohms, thereby providing a relatively low discharge input impedance for the touch pad.

Transistor 26 is connected between center electrode 16, outer electrode 18 and sense line 24. In the preferred embodiment, transistor 26 is a PNP transistor, such as a 2N3086. The base of transistor 26 is connected to inner electrode 16, the transistor emitter is connected to outer electrode 18, and the transistor collector is connected to sense line 24. Transistor 26 provides amplification and buffering of the detection signal directly at the touch pad. Alternatively, a NPN transistor, MOSFET, or other active electrical component which is triggerable may be used in place of a PNP transistor.

Figure 5:
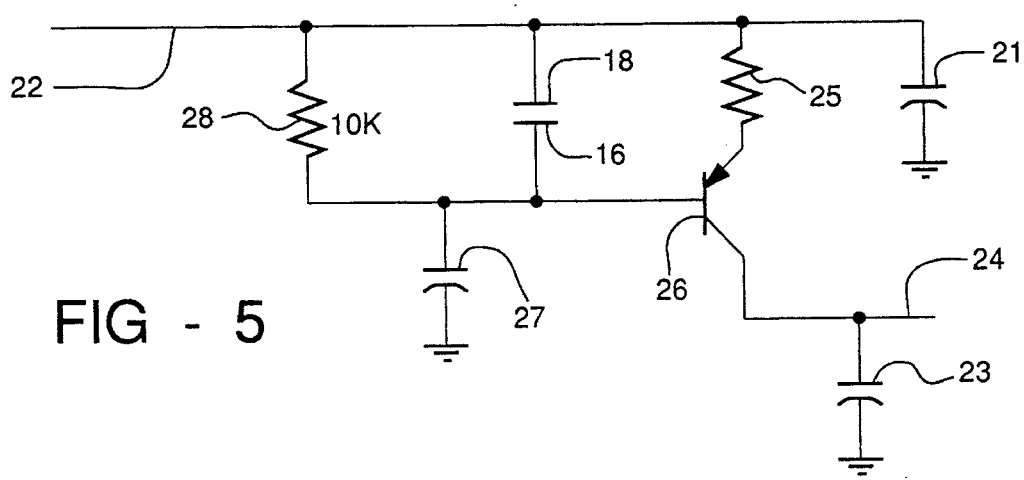
FIG. 5 is an electrical schematic representation of the touch pad shown in FIG. 3.

FIG. 5 illustrates schematically a model of the connection of transistor 26 and resistor 28 to the touch pad. The capacitive coupling between electrodes 16 and 18 is represented in FIG. 5 as a capacitor, with resistor 28 connected in parallel with the capacitor. Resistor 28 acts to discharge the capacitor formed by electrodes 16 and 18. Capacitor 27 represents the parasitic capacitance and the results of contact by a user. Capacitor 21 represents the parasitic capacitance on strobe line 22. Capacitor 23 represents the parasitic capacitance on sense line 24. A resistor 25 can be used to compensate for differences in beta values between different transistors and to compensate for differences in transistor operating characteristics based on temperature. However, in the preferred form, resistor 25 has a value of 0 ohms; i.e., no resistor 25 is used.

Figure 4A:
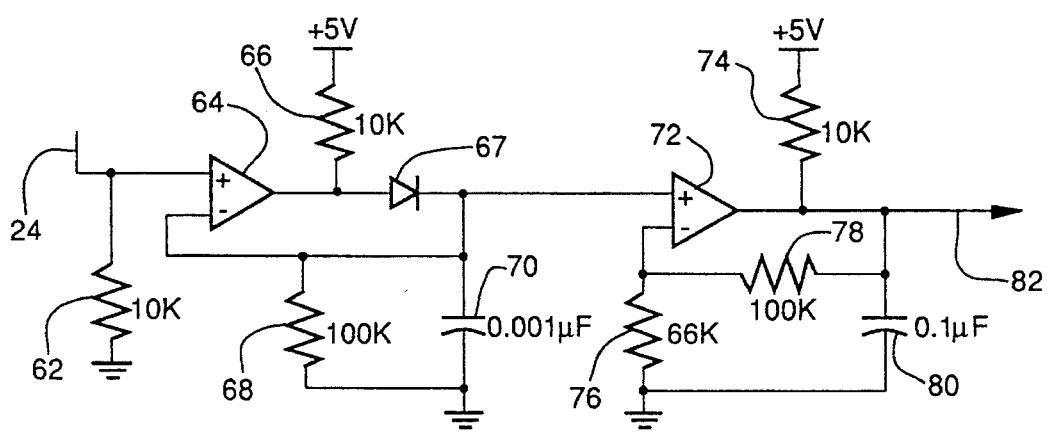
FIG. 4A is the same view as that shown in FIG. 4, but with the touch pad, transistor and resistor mounted on a carrier.

In the preferred embodiment shown in FIG. 4A, electrodes 16 and 18, strobe line 22, and sense line 24 are attached to a flexible carrier 25 manufactured from a polyester material such as Consolidated Graphics No. HS-500, Type 561, Level 2, 0.005 inches thick. Electrodes 16 and 18, strobe line 22, and sense line 24 are formed using a conductive silver ink such as Acheson No. 427 SS, 0.5 mills thick. Transistor 26 and resistor 28 are then attached to the electrodes and lines. A dielectric layer 27 is placed over the electrodes and lines to protect the conducting surfaces. Preferably, the dielectric 27 is Acheson No. ML25089, 1.5 mills thick. The flexible carrier 25 is then bonded to substrate 10 using an adhesive 29 such as 3M No. 467. The flexible carrier 25 can be curved and twisted to conform to the shape of substrate 10.

Alternatively, electrodes 16 and 18, strobe line 22 and sense line 24 can be attached directly to substrate 10. Transistor 26 and resistor 28 are then attached to electrodes 16 and 18, and sense line 24.

Figure 6:
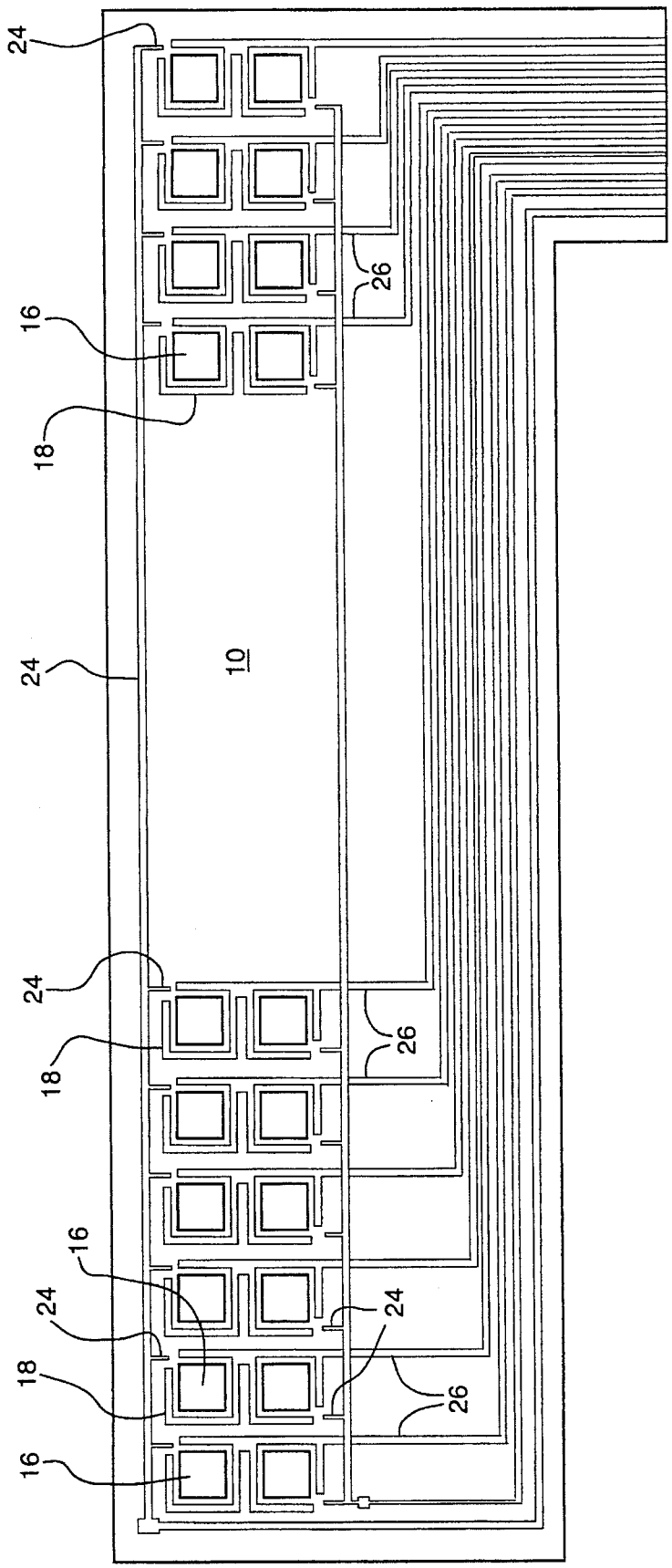
FIG. 6 illustrates a matrix of touch pads according to the present invention as viewed from the back surface of the substrate with the transistors and resistors removed.

Referring to FIG. 6, a matrix of touch pads are attached to substrate 10. Each touch pad in the matrix has the same configuration as the individual pad discussed above. Also, each touch pad contains a transistor 26 and resistor 28, as described earlier. The touch pads are arranged into rows and columns and attached to substrate 10. Each touch pad in a particular column is connected to a common strobe line 22. Each touch pad in a particular row is connected to a common sense line 24. Thus, no two touch pads are connected to the same combination of strobe line 22 and sense line 24.

Although FIG. 6 illustrates a particular arrangement of a touch pad matrix, it will be understood that any number of touch pads can be arranged in any pattern depending on the particular application. The touch pads need not be arranged in rows and columns. Instead, the touch pads may be randomly placed on the substrate or arranged in a circular or diagonal manner. The number of touch pads which can be attached to a substrate is limited only by the size of the substrate.

Figure 7:
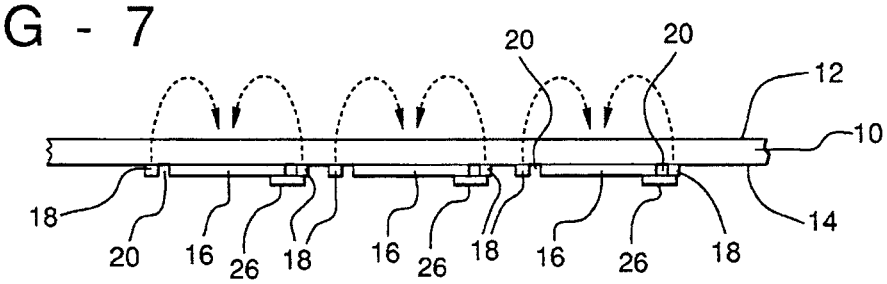
FIG. 7 is a side cross-sectional view of three adjacent touch pads attached to a substrate.

Referring to FIG. 7, three adjacent touch pads are shown attached to substrate 10. The electric field associated with each touch pad is shown with dashed lines. As described with the individual touch pad above, the electric field path originates at outer electrode 18 and follows an arc-shaped path outwardly through substrate 10 and back toward center electrode 16. Since the electric field created by each touch pad is directed toward the center of the pad, the electric fields of adjacent pads are in opposition to one another; i.e., moving in opposite directions. Thus, there is a reduced chance of crosstalk between adjacent pads.

In an alternate embodiment, outer electrode 18 does not substantially surround center electrode 16. An important feature of the arrangement of electrodes 16 and 18 is the creation of opposing electric fields. Thus, an opposing electric field is only needed where an adjacent touch pad exists. For example, if three touch pads are positioned on a substrate in a linear arrangement, outer electrodes 18 are located between adjacent pads. If the middle pad in the three-pad arrangement has adjacent pads to the left and right, outer electrode 18 will be located on the left and right sides of the middle pad. However, since no adjacent pad is located above or below the middle pad, there is no possibility of crosstalk above or below the middle pad. Therefore, outer electrode 18 is not required above or below the middle pad. Similarly, the two end pads in the three-pad arrangement have an adjacent touch pad on one side and therefore require outer electrode 18 only on the single adjacent side.

Figure 12:
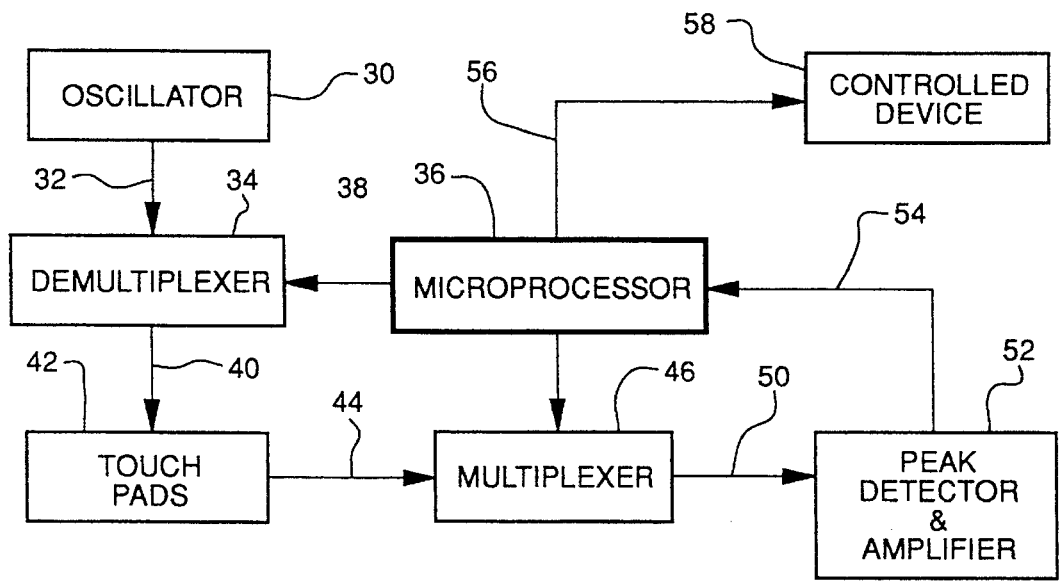
FIG. 12 is a block diagram of the control circuit for a matrix of touch pads.

Referring to FIG. 12, a block diagram of the control circuit for a matrix of touch pads is shown. An oscillator 30 produces a square wave on line 32 which functions as the strobe signal. A demultiplexer 34 receives the strobe signal from oscillator 30. A microprocessor 36, such as Motorola MC68HC05P9, generates a strobe address which is provided to demultiplexer 34 on line 38. The strobe address causes demultiplexer 34 to select one of several output lines which receives the strobe signal. Each output line from demultiplexer 34 is connected to one strobe line 22 for a particular column of touch pads. Thus, the output from oscillator 30 is connected via demultiplexer 34 to strobe line 22 for a particular column of touch pads.

Microprocessor 36 also generates a sense address which is provided to multiplexer 46 on line 48. The sense address causes multiplexer 46 to select one of several input lines which will be monitored as the sense line. Each input line represents the sense line 24 for a particular row of touch pads. Thus, a particular touch pad in the matrix can be selectively monitored by "strobing" a column of pads, and "sensing" a row of pads. Alternatively, the matrix of touch pads can be arranged such that monitoring is accomplished by "strobing" a row of pads and "sensing" a column of pads.

Sense line 24 selected by multiplexer 46 is connected to a peak detector and amplifier circuit 52 using line 50. The output of circuit 52 is provided to microprocessor 36 on line 54. Depending on the signal received from circuit 52, an algorithm running on microprocessor 36 determines whether a controlled device 58 should be activated, deactivated or adjusted.

Figure 13:
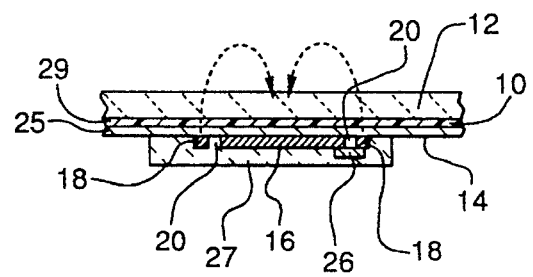
FIG. 13 is an electrical schematic representation of the peak detector circuit shown in FIG. 11.

The peak detector and amplifier circuits shown in FIG. 13 are used in either a single touch pad design or a multiple touch pad design; e.g., a matrix of touch pads. The left portion of FIG. 13 represents the peak detector circuit and the right portion of FIG. 13 represents the amplifier circuit. The detection signal is carried by sense line 24 to the non-inverting input of operational amplifier 64. A resistor 62 is connected between sense line 24 and ground. Preferably, resistor 62 has a value of 10K ohms. A pull-up resistor 66 is connected between +5 volts and the output of operational amplifier 64. In the preferred embodiment, resistor 66 has a value of 10K ohms. The output of operational amplifier 64 is connected through diode 67 to the inverting input of operational amplifier 64. A resistor 68 and capacitor 70 are connected in parallel between ground and the inverting input of operational amplifier 64. Preferably, operational amplifiers 64 and 72 are of the type LM339.

The non-inverting input of operational amplifier 72 receives the output signal from the peak detector circuit. A pull-up resistor 74 is connected between +5 volts and output 82 of operational amplifier 72. In the preferred embodiment, resistor 74 has a value of 10K ohms. Output 82 is connected through a resistor 78 to the inverting input of operational amplifier 72. A resistor 76 is connected between the inverting input of operational amplifier 72 and ground. A capacitor 80 is connected between output 82 and ground.

The value of resistors 76 and 78 determine the level of amplification by the amplifier circuit. In the preferred embodiment, resistor 76 has a value of 66K ohms and resistor 78 has a value of 100K ohms. If a different level of amplification is desired, different values are used for resistors 76 and 78, as will be known to those skilled in the art. Furthermore, detection circuitry may be used which does not require the use of an amplifier connected to the peak detector output. Such a detection circuit will be known to those skilled in the art.

In operation, the touch pad is activated when a user contacts substrate 10. The touch pad will sense contact by a fingertip or other appendage which causes sufficient disruption of the electric field, such as a knuckle, palm or elbow.

Figure 8:
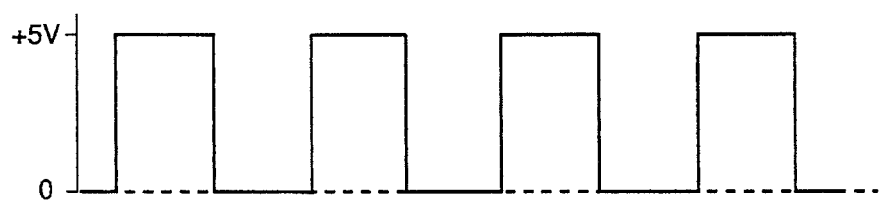
FIG. 8 illustrates the strobe signal waveform.
Figure 9:
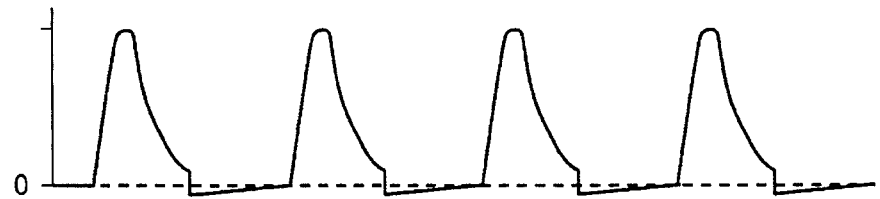
FIG. 9 illustrates the waveform of the detection signal on the sense line.

The strobe signal shown in FIG. 8 is applied to strobe line 22, which is connected to outer electrode 18. Preferably, the strobe signal has a rise time of approximately 7 nsec. However, rise times up to 110 nsec may also be used. Faster rise times, such as 7 nsec, provide lower input impedances and are therefore preferred. The strobe signal creates an electric field at the touch pad, as described earlier. When substrate 10 is not being touched, the waveform shown in FIG. 9 is present on sense line 24. The rising edge of each strobe signal pulse turns on transistor 26, causing the transistor to draw base current. The capacitor formed by electrodes 16 and 18 then discharges through resistor 28 until the next pulse arrives.

The base current of transistor 26 is determined by the equation $I_b = C(dV/dT)$ where $I_B$ is the base current, C is the capacitance of the touch pad, and dV/dT is the change in voltage with respect to time. The change in voltage with respect to time is created by the change in voltage level of the oscillating strobe signal. When a user contacts the touch pad formed by electrodes 16 and 18, the capacitive charge of the touch pad is reduced while the capacitive charge of parasitic capacitor 27 is increased.

Transistor 26 amplifies and buffers the detection signal at each touch pad. This reduces the difference in signal level between touch pads caused by different lead lengths and lead routing paths. By providing a more uniform detection signal level, greater amplification is possible while maintaining the signal level between 0 and +5 volts.

Figure 10:
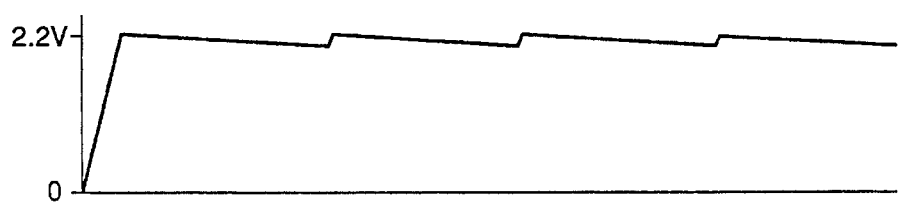
FIG. 10 shows the waveform of the peak detector output signal when the touch pad is not being touched.
Figure 11:
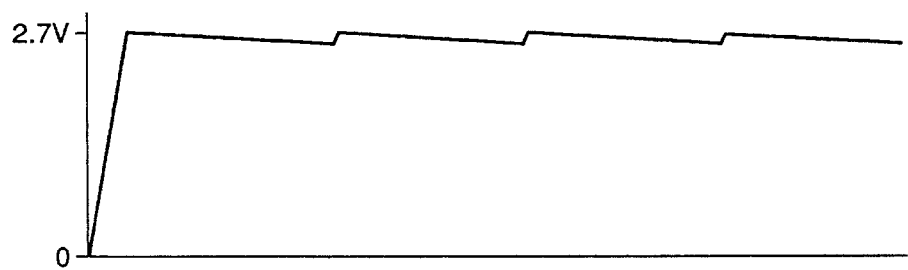
FIG. 11 shows the waveform of the peak detector output signal when a user contacts the touch pad.

The waveform shown in FIG. 9 is applied to the peak detector circuit shown in FIG. 13. The output of the peak detector when not being touched is shown in FIG. 10. The output of the peak detector when touched by a user is shown in FIG. 11. As illustrated in FIGS. 10 and 11, the waveform has the same shape but a different amplitude. Thus, when a user touches the touch pad, the output of the peak detector is altered.

When using a matrix of touch pads, a control circuit (as shown in FIG. 12) is used to selectively monitor each touch pad in the matrix. Microprocessor 36 sequentially selects each strobe line 22 and each sense line 24 by sending the appropriate strobe address and sense address to the demultiplexer and multiplexer, respectively. Each sense line 24 is monitored by peak detector 52 which amplifies the detection signal and transmits it to microprocessor 36.

Figure 14A:
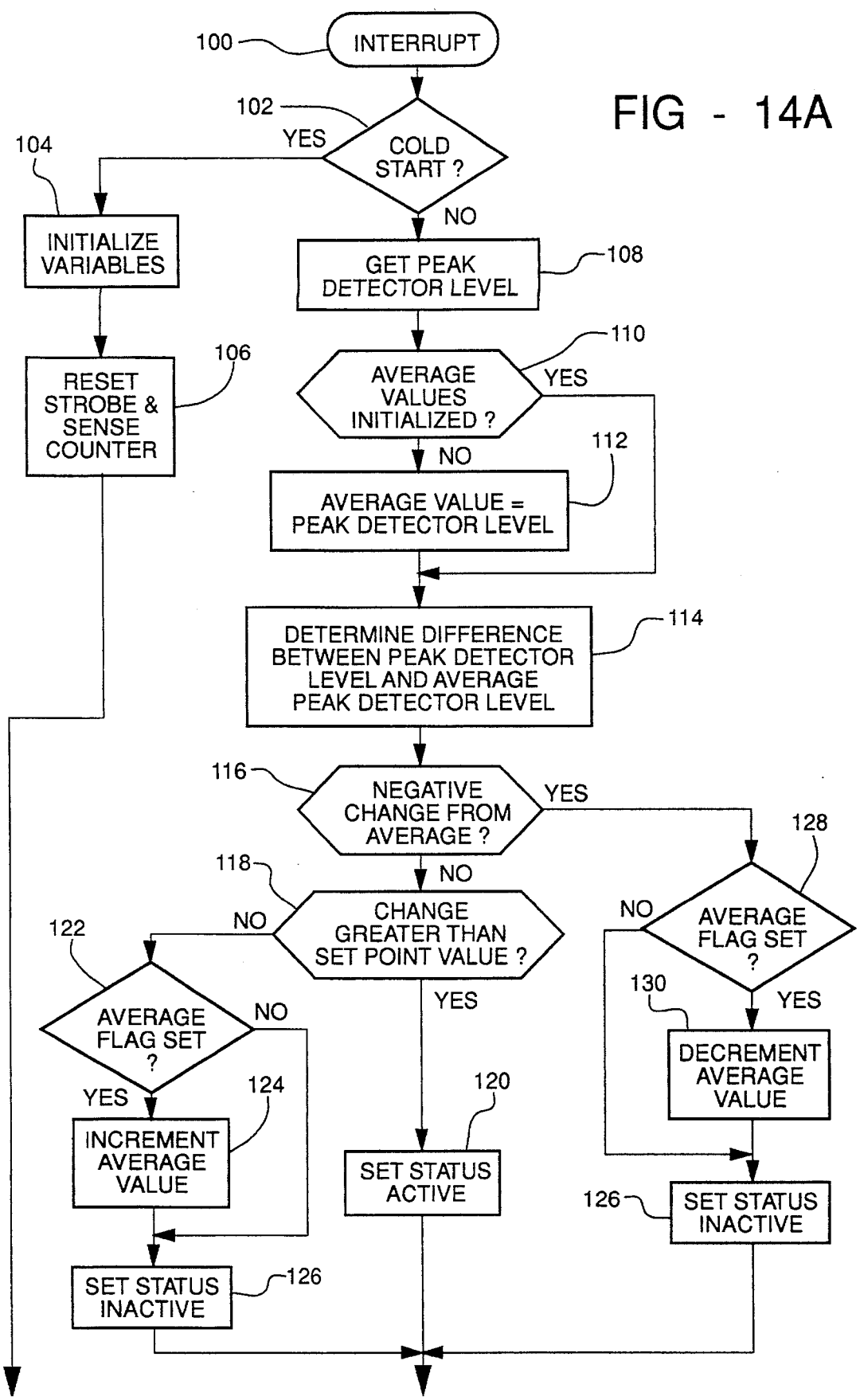
FIGS. 14A and 14B illustrate a flowchart detailing the operation of the microprocessor when monitoring a matrix of touch pads.
Figure 14B:
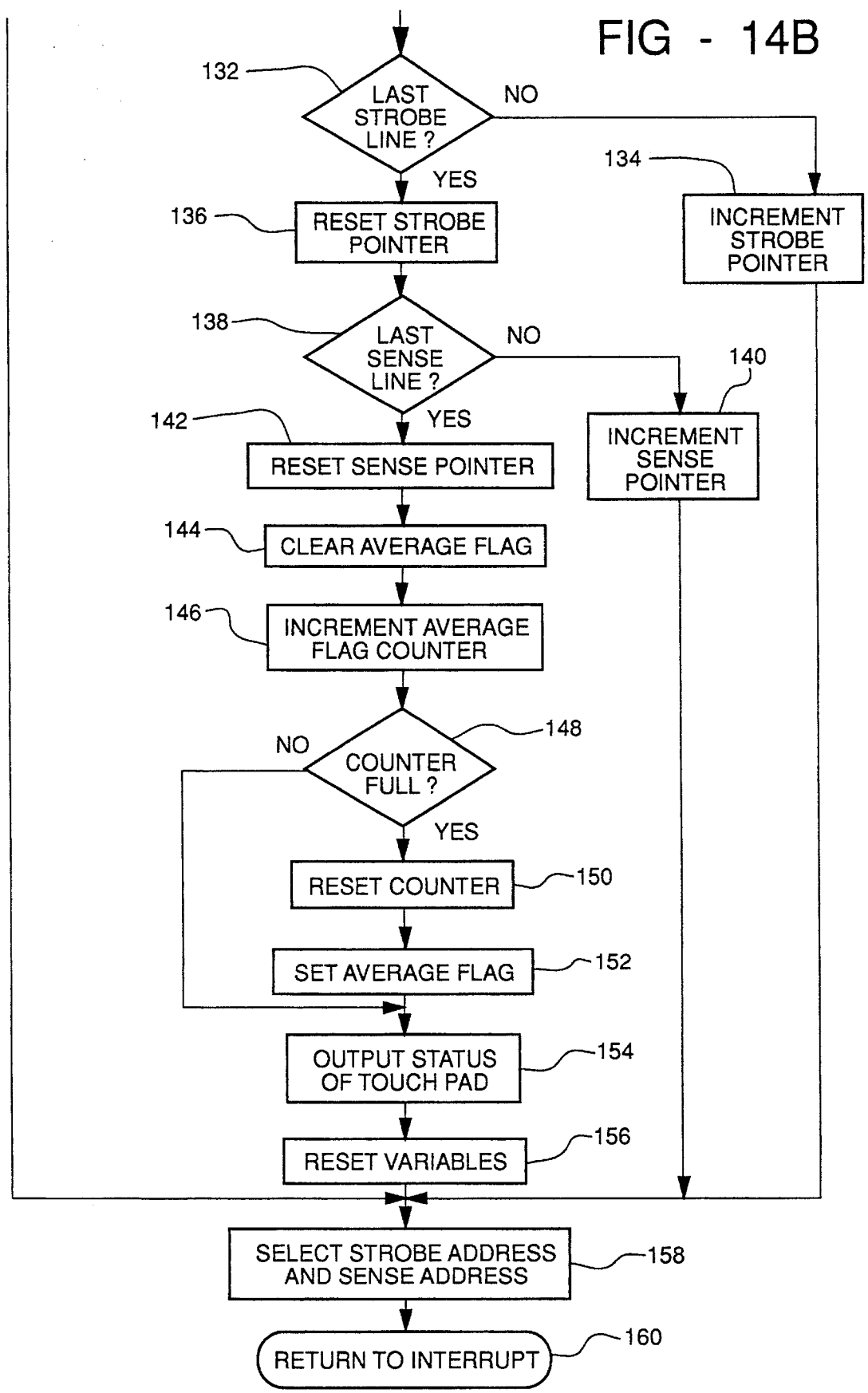

FIGS. 14a and 14b illustrate a flowchart for a program which monitors a matrix of touch pads. The program monitors one touch pad at a time and sequentially scans all touch pads in the matrix. The program begins at block 100 when an interrupt is received. Step 102 checks to determine whether or not the system has just been turned on (cold-started). If the system is being cold-started, step 104 initializes all variables and step 106 resets the strobe and sense counters.

If the system has not been cold-started, then step 108 retrieves the detection signal level. Next, step 110 determines whether the average values have been initialized. An average voltage level is stored for each touch pad to determine the average "non-touched" detection signal level.

If the average values have been initialized, then the program jumps to step 114 to determine the difference between the average detection signal level and the current detection signal level. If the average values have not been initialized, then the current detection signal level is stored as the average value for the particular pad being monitored.

At step 116, if the current detection signal level is less than the average value then the program branches to step 128. At step 128, if the average flag is set then the average flag is decremented. The average flag indicates whether or not the particular signal will be averaged. Since only "non-touched" signals are averaged, the average flag will be set only when a "non-touched" condition is sensed. After decrementing the average value, the pad status is set to inactive (non-touched) at step 126.

At step 116, if the current detection signal level is not less than the average value then step 118 determines whether the difference is greater than a predetermined setpoint. The setpoint is a threshold difference level which must be reached to indicated a "touched" condition. If the difference is greater than the setpoint, then the pad status is set active (touched) at step 120.

If the difference at step 118 is not greater than the setpoint, then the program branches to step 122 to determine whether the average flag is set. If the average flag is not set, the program branches to step 126 and sets the pad status to inactive (non-touched). If the average flag is set, the average value is incremented at step 124 and the pad status is set inactive at step 126.

At step 132, the program determines whether the last strobe line is being sensed. If the current strobe line being sensed is not the last strobe line, then the strobe pointer is incremented at step 134 and jumps to step 158 where a new strobe address and sense address is selected. If the current strobe line being sensed is the last strobe line, then the strobe pointer is reset at step 136. At step 138, the program determines whether the current sense line is the last sense line. If not, step 140 increments the sense pointer and jumps to step 158.

If the current sense line is the last sense line, then a complete scan of the matrix has been completed and step 142 resets the sense pointer. Step 144 clears the average flag and step 146 increments the average flag counter. If step 148 determines that the average flag counter is not full, then the program branches to step 154. If the average flag counter is full, then the counter is reset at step 150 and the average flag is set at step 152.

At step 154, the status of the touch pad being monitored is output from the microprocessor to the remaining control circuitry. Step 156 resets all variables, causing the program to begin scanning at the beginning of the matrix. After all variables have been reset, step 158 selects the new strobe line and sense line to be monitored. Step 160 returns the program to step 100 to wait for the next interrupt.

I claim:

1. A low impedance touch sensor apparatus for detecting manual contact by a human user and capable of activating a controlled device, said touch sensor apparatus comprising:

a dielectric substrate of substantially uniform thickness having first and second opposite surfaces;

a first thin, conductive electrode pad disposed on said first surface of said substrate in a closed, continuous geometric form having an area which affords substantial coverage by a human appendage;

a second thin, conductive electrode disposed on said first surface of said substrate in a spaced, coplanar and substantially surrounding relationship to said first electrode pad; and an active electrical component disposed on said substrate proximate said first and second electrodes and electrically coupled to said first and second electrodes, such that human contact of said substrate activates the controlled device.

2. The apparatus of claim 1 wherein a strobe line is disposed on said first surface of said substrate and electrically coupled to said second electrode.

3. The apparatus of claim 2 wherein a strobe signal is applied to said strobe line, said strobe signal creating an electric field between said first and second electrodes.

4. The apparatus of claim 3 wherein said electric field has an arc-shaped path originating at said second electrode and terminating at said first electrode.

5. The apparatus of claim 1 further including a sense line disposed on said first surface of said substrate proximate said first and second electrodes.

6. The apparatus of claim 5 wherein said touch sensor generates a detection signal on said sense line indicating the status of said touch sensor.

7. The apparatus of claim 6 wherein said detection signal is received by a detection circuit, said detection circuit including a peak detector.

8. The apparatus of claim 6 wherein the level of said detection signal is altered when said substrate is touched by said appendage of said user.

9. The apparatus of claim 1 wherein said first surface of said substrate is a non-touched surface, and said second surface of said substrate is a touched surface.

10. The apparatus of claim 1 wherein said substrate is glass.

11. The apparatus of claim 1 wherein said substrate is plastic.

12. The apparatus of claim 1 wherein a channel is located between said first and second electrodes, said channel having a generally uniform width.

13. The apparatus of claim 1 wherein a plurality of said touch sensors are disposed on said first surface of said substrate.

14. The apparatus of claim 1 wherein a plurality of said touch sensors are disposed on said first surface of said substrate and arranged in a matrix of rows and columns.

15. The apparatus of claim 14 wherein a common strobe line is electrically coupled to said column of touch sensors and a common sense line is electrically coupled to said row of touch sensors.

16. A low impedance touch sensor apparatus for detecting manual contact by a human user and capable of activating a controlled device, said touch sensor apparatus comprising:

a dielectric carrier;

a first thin, conductive electrode pad disposed on said carrier in a closed, continuous geometric form having an area which affords substantial coverage by a human appendage;

a second thin, conductive electrode disposed on said carrier in a spaced and substantially surrounding relationship to said first electrode;

an active electrical component disposed on said carrier proximate said first and second electrodes and electrically coupled to said first and second electrodes; and a dielectric substrate having first and second opposite surfaces, said dielectric carrier disposed on said first surface of said dielectric substrate, such that human contact of said substrate activates the controlled device.

17. The apparatus of claim 16 wherein said first surface of said substrate is a non-touched surface and said second surface of said substrate is a touched surface.

18. A low impedance touch sensor apparatus for detecting manual contact by a human user and capable of activating a controlled device, said touch sensor apparatus comprising:

a dielectric substrate of substantially uniform thickness having first and second opposite surfaces;

a first thin, conductive electrode pad disposed on said first surface of said substrate in a closed, continuous geometric form having an area which affords substantial coverage by a human appendage;

a second thin, conductive electrode disposed on said first surface of said substrate in a spaced, coplanar and substantially surrounding relationship to said first electrode pad; and a transistor disposed on said first surface of said substrate proximate said first and second electrodes and electrically coupled to said first and second electrodes, such that human contact of said substrate activates the controlled device.

19. The apparatus of claim 18 wherein said transistor is a PNP transistor.

20. The apparatus of claim 18 further including a resistor disposed on said first surface of said substrate and electrically coupled between said first and second electrodes.

21. The apparatus of claim 18 further including a sense line disposed on said first surface of said substrate proximate said first and second electrodes.

22. The apparatus of claim 18 wherein said transistor has a base, a collector and an emitter, said transistor base is connected to said first electrode, said transistor collector is connected to said sense line, and said transistor emitter is connected to said second electrode.

23. The apparatus of claim 18 wherein a plurality of said touch sensors are disposed on said first surface of said substrate.

24. The apparatus of claim 21 wherein said touch sensor generates a detection signal on said sense line indicating the status of said touch sensor.

25. The apparatus of claim 24 wherein a signal level of said detection signal is altered when said substrate is touched by said appendage of said user.

26. A touch sensor apparatus including a plurality of touch pads each detecting manual contact by a human user and capable of activating a controlled device, each touch pad comprising:

- a dielectric substrate of substantially uniform thickness and having first and second opposite surfaces;
- a first thin, conductive electrode pad having a peripheral edge and disposed on said first surface of said substrate in a closed, continuous geometric form having an area which affords substantial coverage by a human appendage; and
- a second thin, conductive electrode disposed on said first surface fo said substrate in a spaced relationship to said first electrode, said second electrode surrounding said first electrode on peripheral edges having an adjacent touch pad.

27. The apparatus of claim 26 further including a strobe line disposed on said first surface of said substrate and electrically coupled to said second electrode.

28. The apparatus of claim 27 wherein a strobe signal is applied to said strobe line to create an electric field between said first and second electrodes.

29. The apparatus of claim 28 wherein said electric field is in opposition to electric fields created by adjacent touch pads.

30. The apparatus of claim 26 further including a sense line disposed on said first surface of said substrate proximate said first and second electrodes, said touch sensor generating a detection signal on said sense line.

31. The apparatus of claim 26 wherein said first surface of said substrate is a non-touched surface and said second surface of said substrate is a touched surface.

32. A plurality of touch pads for detecting manual contact by a human user and capable of activating a controlled device, each touch pad comprising:

- a dielectric carrier;
- a first thin, conductive electrode pad having a peripheral edge and disposed on said carrier in a closed, continuous geometric form having an area which affords substantial coverage by a human appendage;
- a second thin, conductive electrode disposed on said carrier in a spaced relationship to said first electrode, said second electrode surrounding said first electrode on peripheral edges having an adjacent touch pad; and
- a dielectric substrate having first and second opposite surfaces, said carrier disposed on said first surface of said substrate, such that human contact of said substrate activates the controlled device.

* * * * *